(12) United States Patent
Ermolov et al.

(10) Patent No.: US 8,980,137 B2
(45) Date of Patent: Mar. 17, 2015

(54) COMPOSITE FOR PROVIDING ELECTROMAGNETIC SHIELDING

(75) Inventors: Vladimir Alexsandrovich Ermolov, Espoo (FI); Markku Anttoni Oksanen, Helsinki (FI); Khattiya Chalapat, Espoo (FI); Gheorghe Sorin Paraoanu, Espoo (FI)

(73) Assignee: Nokia Corporation, Espoo (CA)

( * ) Notice: Subject to any disclaimer, the term of this patent is extended or adjusted under 35 U.S.C. 154(b) by 58 days.

(21) Appl. No.: 13/198,249

(22) Filed: Aug. 4, 2011

(65) Prior Publication Data

US 2013/0032765 A1 Feb. 7, 2013

(51) Int. Cl.

| | |
|---|---|
| *H01B 1/00* | (2006.01) |
| *H01B 1/12* | (2006.01) |
| *H01B 1/24* | (2006.01) |
| *B82Y 30/00* | (2011.01) |
| *H05K 9/00* | (2006.01) |
| *C08K 3/08* | (2006.01) |
| *C08K 7/02* | (2006.01) |
| *C08K 7/24* | (2006.01) |
| *H01B 1/04* | (2006.01) |

(52) U.S. Cl.
CPC . *H01B 1/24* (2013.01); *B82Y 30/00* (2013.01); *H05K 9/009* (2013.01); *C08K 3/08* (2013.01); *C08K 7/02* (2013.01); *C08K 7/24* (2013.01); *C08K 2201/001* (2013.01); *C08K 2201/011* (2013.01); *C08K 2201/016* (2013.01); *Y10S 977/742* (2013.01); *Y10S 977/75* (2013.01); *Y10S 977/752* (2013.01); *Y10S 977/762* (2013.01); *Y10S 977/783* (2013.01); *Y10S 977/84* (2013.01); *Y10S 977/892* (2013.01); *Y10S 977/932* (2013.01)

USPC ........... 252/500; 252/502; 252/512; 252/516; 977/742; 977/750; 977/752; 977/762; 977/783; 977/840; 977/892; 977/932; 977/742

(58) Field of Classification Search
USPC .......... 174/256; 252/500, 502, 511, 512, 516; 427/369, 385.5; 428/340; 521/82, 95; 524/174, 176, 847; 977/742, 750, 752, 977/762, 783, 840, 892, 932
See application file for complete search history.

(56) References Cited

U.S. PATENT DOCUMENTS

| | | | |
|---|---|---|---|
| 6,265,466 B1 | 7/2001 | Glatkowski et al. | 523/137 |
| 2009/0208708 A1* | 8/2009 | Wei et al. | 428/174 |
| 2009/0255706 A1* | 10/2009 | Jiang et al. | 174/102 R |

(Continued)

FOREIGN PATENT DOCUMENTS

| | | |
|---|---|---|
| CN | 1401562 A | 3/2003 |
| CN | 1738522 A | 2/2006 |

(Continued)

OTHER PUBLICATIONS

Chen, Jieliang: "Anti-electromagnetic interference shell for electronic devices", XP002732533; Database CA [Online] Chemical Abstracts Service, Columbus, Ohio, US; Mar. 31, 2006; retrieved from Stn Database accession No. 2006:302885-& CN 1 738 522 A (Hongfujin Precision Industry Co., Ltd., Peop. Rep. China) Feb. 22, 2006; whole document (2 pages).

*Primary Examiner* — Bijan Ahvazi
(74) *Attorney, Agent, or Firm* — Harrington & Smith

(57) ABSTRACT

A composite for providing electromagnetic shielding including a plurality of nanotubes; and a plurality of elongate metallic nanostructures.

19 Claims, 1 Drawing Sheet

(56) References Cited

U.S. PATENT DOCUMENTS

| | | | |
|---|---|---|---|
| 2010/0000770 A1 | 1/2010 | Gupta et al. | 174/256 |
| 2010/0019209 A1* | 1/2010 | Meng et al. | 252/511 |
| 2010/0021682 A1* | 1/2010 | Liang et al. | 428/103 |
| 2010/0187484 A1* | 7/2010 | Worsley et al. | 252/510 |
| 2010/0266838 A1* | 10/2010 | Lee et al. | 428/323 |
| 2011/0014460 A1 | 1/2011 | Kazakevics et al. | 428/340 |

FOREIGN PATENT DOCUMENTS

| | | | |
|---|---|---|---|
| CN | 1738522 A | * | 2/2006 |
| CN | 101812239 A | | 8/2010 |
| WO | WO-2008/078847 A1 | | 7/2008 |

\* cited by examiner

COMPOSITE FOR PROVIDING ELECTROMAGNETIC SHIELDING

TECHNOLOGICAL FIELD

Embodiments of the present invention relate to a composite for providing electromagnetic shielding.

BACKGROUND

Electromagnetic shielding has many applications. It may, for example, be used to shield electronic components from radio frequency (RF) electromagnetic radiation or to prevent RF electromagnetic radiation from being radiated from components. This can be particularly important if a radio frequency transmitter such as, for example, a mobile cellular telephone transceiver is in close proximity to other electronic components.

BRIEF SUMMARY

According to various, but not necessarily all, embodiments of the invention there is provided a composite for providing electromagnetic shielding comprising: a plurality of elongate nanostructures; and a plurality of elongate conductive elements.

The composite material may, for example, be a thin shell molded into different shapes. It can therefore provide effective electromagnetic shielding without occupying valuable space which is at a premium in a hand-portable electronic apparatus.

BRIEF DESCRIPTION

Figure 1:
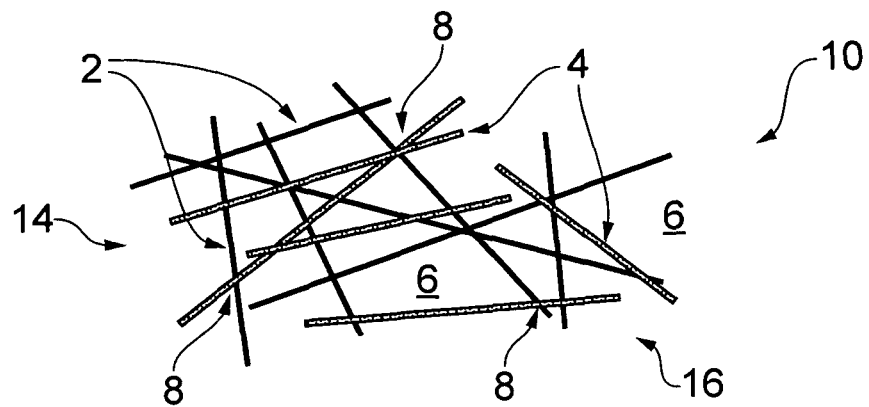
Figure 2:
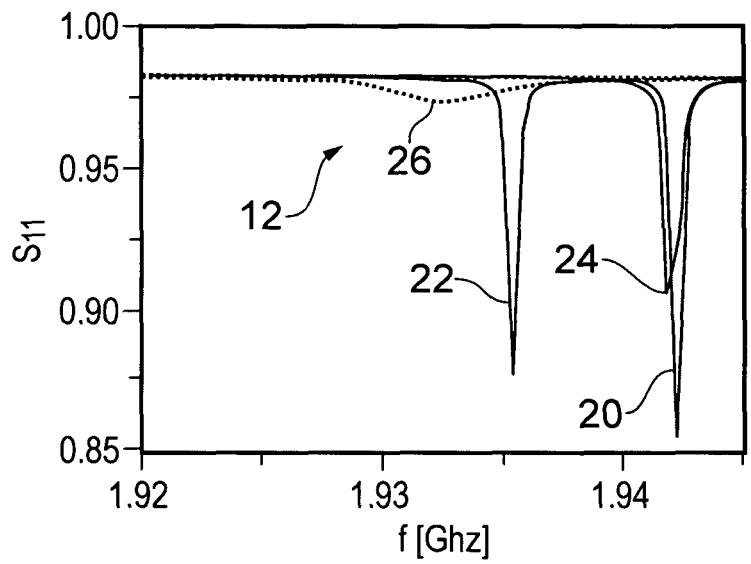
Figure 3:
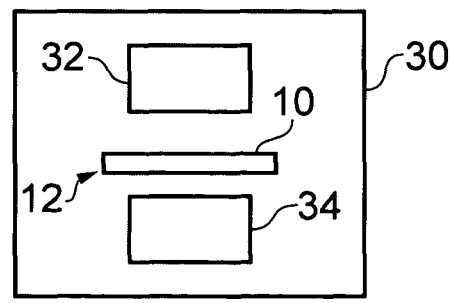

For a better understanding of various examples of embodiments of the present invention reference will now be made by way of example only to the accompanying drawings in which:

FIG. 1 schematically illustrates a composite for providing electromagnetic shielding;

FIG. 2 schematically demonstrates an electromagnetic shielding effect by the composite; and FIG. 3 schematically illustrates an apparatus that uses the composite material for electromagnetic shielding.

DETAILED DESCRIPTION

FIG. 1 schematically illustrates a composite 10 for providing electromagnetic shielding 12.

The composite 10 comprises a plurality of nanostructures 2 and a plurality of conductive elements 4.

In this example, the plurality of nanostructures are elongate nanostructures 2 and the plurality of conductive elements are elongate conductive elements. Elongate in this sense means that a length is greater than a width. An aspect ratio defined by the ratio of length to width may be, for example, in some embodiments greater than 100 or even 1000 for the elongate nanostructures and/or the elongate conductive elements.

In this example, the plurality of elongate nanostructures 2 and the plurality of elongate conductive elements 4 form an anisotropic mixture 16. That is, in general, neither the plurality of elongate nanostructures 2 nor the plurality of elongate conductive elements 4 are aligned along a particular vector. However, there may be applications where this may be desirable. For example, if a polarization of a radio frequency electromagnetic field is known, alignment relative to the polarization may be desirable. Alignment may, for example, be achieved by applying a strain force and/or an electric field during manufacture.

In the illustrated example, at least some of the plurality of elongate nanostructures 2 and at least some of the plurality of elongate conductive elements 4 contact 8 to form a connected network 14.

The connected network 14 is maintained by a binder that fills at least some of the voids between the plurality of elongate nanostructures 2 and the plurality of elongate conductive elements 4. The binder may, for example, be a polymer.

The density of elongate nanostructures 2 and the density of elongate conductive elements 4 are selected to control the connectedness of the connected network 14. By increasing the density of elongate nanostructures 2 and the density of elongate conductive elements 4 it is possible to increase the number of contacts 8 between the elongate nanostructures 2 and the elongate conductive elements 4. If the connectedness of the network is defined as the number of network nodes (contacts 8), then as the number of contacts 8 increases the connectedness of the network increases.

It may be desirable to control 'electrical connectedness'. If the connectedness of the network is defined as the number of network nodes (contacts 8), then the 'electrical connectedness' of the network is defined as the number of network nodes that have a lower electrical impedance (lower-impedance contacts 8). For example, a contact 8 between the elongate nanostructures 2 and the elongate conductive elements 4 may form a lower electrical impedance node where the contact electrical impedance is below a particular value or it may form a higher electrical impedance node where the contact electrical impedance is above a particular value. The contact electrical impedance may comprise an electrical resistive component R and/or an electrical reactive component jX The reactive component may include a capacitive component and/or an inductive component. The density and characteristics of elongate nanostructures 2 and the density and characteristics of elongate conductive elements 4 are selected to control the connectedness of the connected network 14 and the contact electrical impedance when they contact.

The plurality of elongate nanostructures 2 may consist of a single species (class) of nanostructure.

Alternatively the plurality of elongate nanostructures 2 may consist of a multiple different species (classes) of nanostructure.

A species (class) may be defined in different ways.

For example, 'species' may be defined structurally. In this example, nanostructures of the same species have the same or similar structures. For example they may all be either nanotubes (single walled or multi-wall nanotubes), nanofibers, nanowires or nanotube yarns.

As another example, 'species' may be defined compositionally. In this example, nanostructures of the same species have the same or similar compositions. For example they may all be nanostructures formed from either carbon, boron nitride, silicon carbide, metal or, for example, other materials capable of forming nanotubes.

As another example, 'species' may be defined geometrically. In this example, nanostructures of the same species may be nanotubes that have the same chiral vector.

As another example, 'species' may be defined functionally. In this example, nanostructures of the same species have the same functional features such, for example, conductivity. They may, for example, all be semiconducting or narrow band gap semiconducting or metallic conducting.

It should also be appreciated that a 'species' may be defined using some other common characteristic such as for example length In addition, a 'species' may be defined using any combination or sub-combination of characteristics. For example, a species (class) may be defined structurally and/or compositionally and/or geometrically and/or functionally and/or using length etc.

The elongate conductive elements 4 have metallic conductivity. They may be metallic, for example, they may be metal wires. They may also be nanostructures (a nanostructure in this document means a structure having a smallest dimension that is less than 1 µm), The electromagnetic shielding 12 provided by the composite 10 is illustrated in FIG. 2. This figure illustrates a reflection spectra for a resonant cavity for different samples.

The trace 20 illustrates a strong resonance when the resonant cavity is empty.

The trace 22 illustrates a strong resonance when the resonant cavity comprises a sample comprising only elongate conductive elements 4 (Cu wire that has a width 90 and length 2 cm).

The trace 24 illustrates a strong resonance when the resonant cavity comprises a sample comprising only multi-walled carbon nanotube (MCNT) yarn that has a width 200 nm and a length 5 mm.

The trace 26 illustrates a very weak resonance when the resonant cavity comprises a sample of the composite 10 which comprises a plurality of elongate nanostructures 2 and a plurality of elongate conductive elements 4 as an anisotropic mixture.

The elongate nanostructures comprise a single species, multi-walled carbon nanotube (MCNT) yarn, that has a width 200 nm and a length 5 mm. The elongate conductive elements 4 are Cu wire that has a width 90 and length 2 cm.

It is therefore established experimentally that a mix of a plurality of elongate nanostructures 2 and a plurality of elongate conductive elements 4 gives much better shielding efficiency than only a plurality of elongate nanostructures 2 or a plurality of elongate conductive elements 4 at the same concentrations. It will be observed that there is a surprising reduction in the resonance for the heterogeneous combination of the plurality of elongate nanostructures 2 and the plurality of elongate conductive elements 4 (trace 26) when compared with either a sample comprising only the plurality of elongate nanostructures 2 (trace 24) or a sample comprising only the plurality of elongate conductive elements 4 (trace 22).

It is believed that heterogeneous contacts formed between at least some of the plurality of elongate nanostructures 2 and at least some of the plurality of elongate conductive elements 4 provide for the surprising reduction.

For high aspect ratio-filler/polymer composites several techniques have been developed to better disperse fillers, including in-situ polymerization, solution processing, spin casting and melt spinning. In addition, some processing aids have been used to enhance the dispersion such as sonification, magnetic fields, surfactants and functionalization.

A wide range of polymeric resins, natural or synthetic, may be used as filler in the composite material 10. Suitable synthetic polymeric resins include, but are not limited to, polyethylene, polypropylene, polyvinyl chloride, unsaturated polyesters, etc.

The polymeric materials can contain other ingredients and additives well known in the field of polymers to provide various desirable properties.

The amount of elongate nanostructures 2 and elongate conductive elements 4 in the composite will typically be in the range of 0.001 to 15 weight percent based on the amount of polymer, for example, 0.01 to 5 weight percent.

The elongate nanostructures 2 and elongate conductive elements 4 are typically dispersed essentially homogeneously throughout the bulk of the polymeric material but can also be present in gradient fashion, increasing or decreasing in amount (e.g. concentration) from the external surface toward the middle of the material or from one surface to another, etc.

The amount of elongate nanostructures 2 will be chosen to be effective for the desired electromagnetic shielding.

Electromagnetic shielding has many applications. FIG. 3 schematically illustrates an apparatus 30 where composite material 10 is used to provide electromagnetic shielding from a source 32 of electromagnet radiation and electronic components 34. In this example, the source is internal to the apparatus 30 in other examples not illustrated the source 32 may be outside the apparatus 30.

The electromagnetic radiation may be, for example, radio frequency (RF) electromagnetic radiation. For example the source 32 may be a radio frequency transmitter such as, for example, a mobile cellular telephone transceiver that is in close proximity to electronic component(s) 34.

The composite material may, for example, be a thin shell molded into different shapes. It can therefore provide effective electromagnetic shielding without occupying valuable space which is at a premium in a hand-portable electronic apparatus.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A composite for providing electromagnetic shielding comprising:
   a plurality of nanotubes;
   a plurality of elongate metallic nanostructures; and
   a binder that fills at least a plurality of voids between the plurality of nanotubes and the plurality of elongate metallic nanostructures,
   wherein the plurality of nanotubes and the plurality of elongate metallic nanostructures form a mixture and are dispersed throughout said binder,
   the plurality of nanotubes consist of a plurality of nanotube yarns, the plurality of nanotube yarns is not aligned, and the plurality of elongate metallic nanostructures is not aligned;
   wherein the nanotubes have, on average, an aspect ratio greater than 100.

2. The composite according to claim 1, wherein at least some of the plurality of nanotubes and at least some of the plurality of elongate metallic nanostructures contact to form a connected network.

3. The composite according to claim 2, wherein the density of nanotubes and the density of elongate metallic nanostructures are selected to control the connectedness of the connected network.

4. The composite according to claim 1, wherein at least some of the plurality of nanotubes and at least some of the plurality of elongate metallic nanostructures contact to form an electrically connected network.

5. The composite according to claim 1, wherein the nanotubes consist of a single species of nanostructure.

6. The composite according to claim 5, wherein the species of nanostructures is selected from the group consisting of single walled nanotubes, and multi-wall nanotubes.

7. The composite according to claim 5, wherein the species of nanostructures is selected from the group consisting of carbon, boron nitride, silicon carbide, metal and other materials capable of forming nanotubes.

8. The composite according to claim 5, wherein the species of nanostructures have the same chiral vector.

9. The composite according to claim 5, wherein the single species of nanostructures have the same length.

10. The composite according to claim 5, wherein the single species of nanostructures have the same conductivity.

11. The composite according to claim 1, wherein the species of nanostructures have the same conductivity.

12. The composite according to claim 1, wherein the elongate metallic nanostructures are metal wires.

13. The composite according to claim 1, wherein the binder is a polymer.

14. A method comprising: mixing a plurality of nanotubes and a plurality of elongate metallic nanostructures according to claim 1 with at least one other material to form the composite for proving electromagnetic shielding.

15. The claim according to claim 14, wherein the amount of nanotubes and elongate metallic nanostructures is between 0.001 to 15 percent, by mass, of the at least one other material.

16. An apparatus comprising a molded shell formed of the composite material of claim 1.

17. The apparatus according to claim 16, wherein the molded shell is configured to provide electromagnetic shielding from radio frequency electromagnetic radiation produced by a radio frequency transmitter that is internal to the apparatus.

18. The composite according to claim 1, wherein a total amount of nanotubes and elongate metallic nanostructures in the composite is in the range of 0.001 to 15 weight percent based on the amount of binder.

19. The composite according to claim 1, wherein the binder comprises a polymeric resin selected from a group consisting of polyethylene, polypropylene, polyvinyl chloride, and unsaturated polyesters.

\* \* \* \* \*

UNITED STATES PATENT AND TRADEMARK OFFICE
CERTIFICATE OF CORRECTION

PATENT NO. : 8,980,137 B2
APPLICATION NO. : 13/198249
DATED : March 17, 2015
INVENTOR(S) : Vladimir Alexsandrovich Ermolov et al.

It is certified that error appears in the above-identified patent and that said Letters Patent is hereby corrected as shown below:

In the Claims

In Claim 11:
Column 5, line 28, "species of nanostructures have the same conductivity" should be deleted and --nanotubes consist of multiple different species of nanostructures-- should be inserted.

In Claim 14:
Column 6, line 8, "proving" should be deleted and --providing-- should be inserted.

Signed and Sealed this
Twenty-third Day of June, 2015

Michelle K. Lee
*Director of the United States Patent and Trademark Office*